United States Patent
Tan et al.

(10) Patent No.: US 11,963,432 B2
(45) Date of Patent: Apr. 16, 2024

(54) DISPLAY SUBSTRATE, METHOD OF MANUFACTURING DISPLAY SUBSTRATE, AND DISPLAY DEVICE

(71) Applicants: MIANYANG BOE OPTOELECTRONICS TECHNOLOGY CO., Ltd., Mianyang (CN); BOE TECHNOLOGY GROUP CO., LTD., Beijing (CN)

(72) Inventors: Yaohong Tan, Beijing (CN); Jenyu Lee, Beijing (CN); Wen Sun, Beijing (CN); Yuanchen Chin, Beijing (CN)

(73) Assignees: MIANYANG BOE OPTOELECTRONICS TECHNOLOGY CO., Ltd., Mianyang (CN); BOE TECHNOLOGY GROUP CO., LTD., Beijing (CN)

( * ) Notice: Subject to any disclaimer, the term of this patent is extended or adjusted under 35 U.S.C. 154(b) by 415 days.

(21) Appl. No.: 17/512,862

(22) Filed: Oct. 28, 2021

(65) Prior Publication Data
US 2022/0302423 A1   Sep. 22, 2022

(30) Foreign Application Priority Data

Mar. 19, 2021   (CN) .......................... 202110299801.2

(51) Int. Cl.
*H10K 59/122*   (2023.01)
*H10K 59/124*   (2023.01)
(Continued)

(52) U.S. Cl.
CPC ........... *H10K 71/00* (2023.02); *H10K 59/124* (2023.02); *H10K 59/131* (2023.02); *H10K 71/80* (2023.02); *H10K 77/111* (2023.02)

(58) Field of Classification Search
None
See application file for complete search history.

(56) References Cited

U.S. PATENT DOCUMENTS 11,108,021 B2   8/2021   Zhai et al.
2016/0293884 A1*   10/2016   Zhang .................... H10K 71/00
(Continued)

FOREIGN PATENT DOCUMENTS

| CN | 110165082 A | 8/2019 |
|----|-------------|--------|
| CN | 110797377 A | 2/2020 |
| CN | 111029484 A | 4/2020 |

OTHER PUBLICATIONS

First Office Action, including search report, for Chinese Patent Application No. 202110299801.2, dated Jun. 13, 2022, 16 pages.

*Primary Examiner* — Bilkis Jahan
(74) *Attorney, Agent, or Firm* — Westman, Champlin & Koehler, P.A.

(57) ABSTRACT

A display substrate, including: a first film layer arranged on a side of a base substrate, a second film layer arranged on a side of the first film layer away from the base substrate and an adhesive material portion arranged therebetween; wherein the first film layer has a first surface and a second surface respectfully facing the second film layer and the first film layer, and the first surface is at least partially in contact with the second surface; the adhesive material portion is arranged at least partially in a non-flat contact area formed between the first film layer and the second film layer, to adhere the first film layer and the second film layer; an adhesion between the adhesive material portion and each of the first film layer and the second film layer is greater than an adhesion between the first film layer and the second film layer.

15 Claims, 6 Drawing Sheets

(51) Int. Cl.
*H10K 71/00* (2023.01)
*H10K 59/131* (2023.01)
*H10K 71/80* (2023.01)
*H10K 77/10* (2023.01)

(56) References Cited

U.S. PATENT DOCUMENTS

| | | | |
|---|---|---|---|
| 2017/0155082 A1* | 6/2017 | Mu | H10K 50/8428 |
| 2019/0067606 A1* | 2/2019 | Han | H10K 77/111 |
| 2020/0136087 A1* | 4/2020 | Kim | H10K 50/844 |
| 2020/0365829 A1* | 11/2020 | Sung | H10K 71/00 |
| 2021/0193959 A1 | 6/2021 | Zhai et al. | |

* cited by examiner

DISPLAY SUBSTRATE, METHOD OF MANUFACTURING DISPLAY SUBSTRATE, AND DISPLAY DEVICE

CROSS REFERENCE

This application claims the benefit of Chinese Patent Application No. 202110299801.2 filed on Mar. 19, 2021 in the State Intellectual Property Office of China, the whole disclosure of which is incorporated herein by reference.

TECHNICAL FIELD

The present disclosure relates to a field of display technology, and in particular to a display substrate, a method of manufacturing a display substrate, and a display device.

BACKGROUND

In the related art, subsequent to a packaging process of an organic light emitting diode (OLED), a back plate needs to be separated from a flexible film. In a separation process, laser is generally used to scan a layer of material of a flexible film portion on the back plate back and forth, so that this layer of material absorbs laser energy and cracks after reaching a cracking temperature, and then the separation may be achieved finally.

The above information disclosed in this section is only for the understanding of the background of a technical concept of the present disclosure. Therefore, the above information may contain information that does not constitute the related art.

SUMMARY

In an aspect, a display substrate is provided, comprising: a base substrate; a first film layer arranged on a side of the base substrate; a second film layer arranged on a side of the first film layer away from the base substrate; and an adhesive material portion arranged between the first film layer and the second film layer; wherein the first film layer has a first surface facing the second film layer, the second film layer has a second surface facing the first film layer, and the first surface is at least partially in contact with the second surface; a non-flat contact area is formed between the first film layer and the second film layer, and the adhesive material portion is arranged at least partially in the non-flat contact area to adhere the first film layer and the second film layer; and an adhesion between the adhesive material portion and the first film layer is greater than an adhesion between the first film layer and the second film layer, and an adhesion between the adhesive material portion and the second film layer is greater than the adhesion between the first film layer and the second film layer.

According to some exemplary embodiments, the adhesive material portion comprises a first sub-portion and a second sub-portion, a first included angle is formed between the first sub-portion and the second sub-portion, and the first included angle is an obtuse angle.

According to some exemplary embodiments, the first surface comprises a first sub-surface and a second sub-surface, a second included angle is formed between the first sub-surface and the second sub-surface, and the second included angle is an obtuse angle; the non-flat contact area comprises at least a bonding position between the first sub-surface and the second sub-surface; and the adhesive material portion further comprises a third sub-portion located between the first sub-portion and the second sub-portion, the first sub-portion is in contact with the first sub-surface, the second sub-portion is in contact with the second sub-surface, and the third sub-portion covers the bonding position between the first sub-surface and the second sub-surface.

According to some exemplary embodiments, the first sub-portion is in contact with the second surface and is not in contact with the first surface, and the second sub-portion is in contact with the first surface and the second surface; and the second sub-portion covers the non-flat contact area.

According to some exemplary embodiments, the adhesive material portion contains indium tin oxide.

According to some exemplary embodiments, the adhesive material portion has a thickness in a range of 50 nm to 100 nm.

According to some exemplary embodiments, a width of an orthographic projection of the adhesive material portion on the base substrate is 4 times to 6 times the thickness of the adhesive material portion.

According to some exemplary embodiments, the first film layer comprises a passivation layer, and the second film layer comprises a planarization layer.

According to some exemplary embodiments, the first film layer comprises an isolation component, and the second film layer comprises a luminescent material layer.

According to some exemplary embodiments, the base substrate contains a polyimide material.

In another aspect, a display device is provided, including the display substrate described above.

In yet another aspect, a method of manufacturing a display substrate is provided, comprising: forming a base substrate on a back plate; forming a first film layer on a side of the base substrate away from the back plate; forming an adhesive material portion on a side of the first film layer away from the base substrate; forming a second film layer on a side of the adhesive material portion away from the base substrate; and peeling the base substrate from the back plate, wherein the first film layer, the adhesive material portion and the second film layer are formed on the base substrate; wherein the first film layer has a first surface facing the second film layer, the second film layer has a second surface facing the first film layer, and the first surface is at least partially in contact with the second surface; wherein a non-flat contact area is formed between the first film layer and the second film layer, and the adhesive material portion is arranged at least partially in the non-flat contact area to adhere the first film layer and the second film layer; and wherein an adhesion between the adhesive material portion and the first film layer is greater than an adhesion between the first film layer and the second film layer, and an adhesion between the adhesive material portion and the second film layer is greater than the adhesion between the first film layer and the second film layer.

According to some exemplary embodiments, the adhesive material portion is formed by a sputtering deposition process.

According to some exemplary embodiments, the adhesive material portion is formed by a cold spraying deposition process.

According to some exemplary embodiments, the base substrate is peeled from the back plate by using a laser lift off process.

BRIEF DESCRIPTION OF THE DRAWINGS

Exemplary embodiments of the present disclosure are described in detail with reference to the drawings through which features and advantages of the present disclosure will become more apparent.

FIG. 3a is an enlarged view of a specific structure of the display substrate according to the exemplary embodiment of FIG. 2a.

DETAILED DESCRIPTION OF EMBODIMENTS

Figure 1:
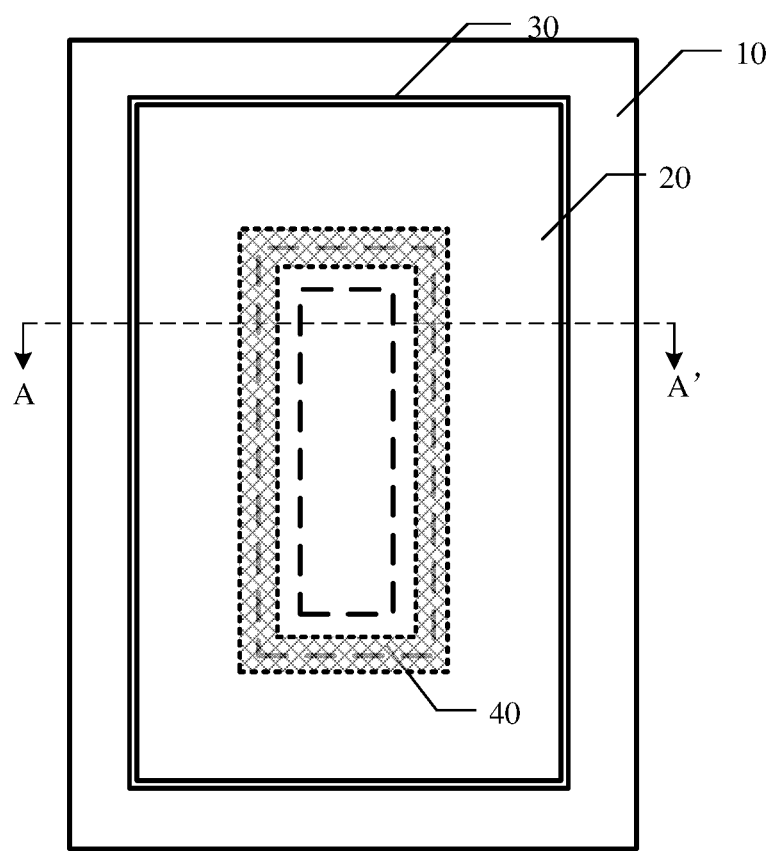
FIG. 1 is a plan view of a structure of a display substrate according to some exemplary embodiments of the present disclosure.

In order to make objectives, technical solutions and advantages of the present disclosure more apparent, the technical solutions of the embodiments of the present disclosure are clearly and completely described below with reference to the drawings. Obviously, the described embodiments are only a part but not all of the embodiments of the present disclosure. Based on the described embodiments of the present disclosure, all other embodiments obtained by those of ordinary skill in the art without carrying out inventive effort fall within the protection scope of the present disclosure.

It should be noted that, in the drawings, for clarity and/or description purposes, sizes and relative sizes of elements may be enlarged. Accordingly, a size and a relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XY YZ and XZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", etc. may be used herein to describe a relationship between one element or feature and another element or feature as shown in the drawing. It should be understood that the spatial relationship terms are intended to cover other different orientations of a device in use or operation in addition to an orientation described in the drawing. For example, if the device in the drawing is turned upside down, an element or feature described as "below" or "under" another element or feature will be oriented "above" or "on" the another element or feature.

It should be noted that the expression "non-flat contact area" used herein may refer to an area with an angle change on a surface, such as an intersection area formed by two adjacent surfaces, or an area between two adjacent surfaces that includes a bending surface, a hole, a gap, a depression, or a groove. The expression "flat surface" may mean that there are no obvious protrusions or depressions on the surface, or refers to a surface without an angle change. The "nonobvious protrusions or depressions" here means that except for fluctuations caused by a manufacturing process, heights of the surface at each position have no difference outside a process error range.

Here, the expression "adhesion" may refer to a magnitude of a bonding force between two material layers in contact with each other. For example, the material layers in contact with each other may be different material layers formed by different processes, or different material layers formed by a same process. The adhesion indicates a bonding strength between the two materials. The greater the bonding strength, the greater the adhesion. On the contrary, the less the bonding strength, the less the adhesion.

In the related art, laser may be used to scan a layer of material of a flexible film portion on a back plate back and forth, so that this layer of material absorbs laser energy and cracks after reaching a cracking temperature, and then a separation of the back plate and the flexible film may be achieved finally. However, when the material is irradiated by the laser, charged ions may be generated during the cracking process. The charged ions may erupt in a gaseous form to form a plasma, and an impact wave may be generated with the plasma. After the impact wave is transmitted to the back plate, a part of the impact wave may be reflected into the flexible film. The reflected energy may impact a film layer structure of the flexible film in a fan shape, and a shock wave may be generated in an area where the fan-shaped reflected energy is superimposed. The shock wave may cause defects such as peeling and bubbles on a fragile part of the film layer structure during a diffusion process, and may even cause a crack growth in an original film layer. Finally, the crack may become a penetrating crack penetrating a cross-section of the film layer, which may become a water vapor channel and cause a product failure.

Therefore, in a production of OLED, how to ensure that the film material does not produce cracks, bubbles and other defects during the process of separating the flexible film from the back plate has become an important topic for researchers and developers.

FIG. 1 is a plan view of a structure of a display substrate according to some exemplary embodiments of the present disclosure. As shown in FIG. 1, the display substrate includes a base substrate 10, a first film layer 20, a second film layer 30, and an adhesive material portion 40 arranged between the first film layer 20 and the second film layer 30.

Figure 2A:
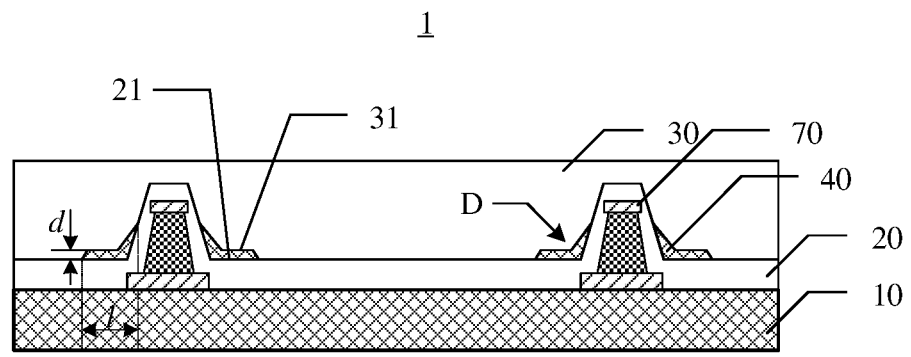
FIG. 2a is a schematic cross-sectional structural diagram of the display substrate according to some exemplary embodiments of the present disclosure taken along line AA' in FIG. 1.
Figure 2B:
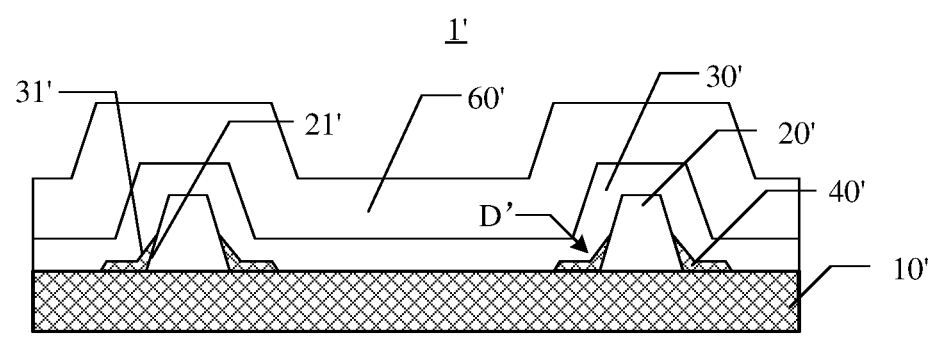
FIG. 2b is a schematic cross-sectional structural diagram of the display substrate according to some other exemplary embodiments of the present disclosure taken along line AA' in FIG. 1.

FIG. 2a is a schematic cross-sectional structural diagram of the display substrate according to some exemplary embodiments of the present disclosure taken along line AA' in FIG. 1. FIG. 2b is a schematic cross-sectional structural diagram of the display substrate according to some other exemplary embodiments of the present disclosure taken along line AA' in FIG. 1.

As shown in FIG. 2a, the display substrate 1 includes the base substrate 10 at a bottom; the first film layer 20 arranged on a side of the base substrate 10; the second film layer 30 arranged on a side of the first film layer 20 away from the base substrate 10; and the adhesive material portion 40 arranged between the first film layer 20 and the second film layer 30. Other film layers may be provided between the first film layer 20 and the base substrate 10, and the first film layer 20 may be in direct contact with the base substrate 10 or not in direct contact with the base substrate 10. For example, the first film layer 20 may completely cover an upper surface of the base substrate 10 or partially cover the upper surface of the base substrate 10.

For example, as shown in FIG. 2a, the first film layer 20 may be a passivation layer, and the second film layer 30 may be a planarization layer. The passivation layer 20 and the planarization layer 30 may contain an inorganic insulating material, an organic insulating material, or any combination thereof. For example, the organic insulating material may include polyimide, polyamide, acrylic resin, phenol resin, benzocyclobutene, and the like.

In some embodiments, a crack detection structure 70 may be further provided under the passivation layer. The crack detection structure 70 may include a metal layer that may be any metal layer of a driving circuit layer in the display device. For example, the metal layer may be a source/drain metal layer, or other metal film layer containing the same material as the source/drain metal layer, such as a transfer electrode used to electrically connect the driving circuit layer of the display device and an anode electrode of the light emitting device, generally referred to as an SD2 layer. A material of the SD2 layer may be of a trapezoidal structure formed of three layers of Ti—Al—Ti materials, and a middle position of the trapezoidal structure is recessed inward.

For example, as shown in FIG. 2b, a first film layer 20' may include an isolation component, and a second film layer 30' may include a luminescent material layer. The isolation component 20' may contain an inorganic insulating material, an organic insulating material, a metal material, or any combination thereof. The luminescent material layer 30' may include an organic luminescent material layer.

In some embodiments, an encapsulation layer is further provided above the isolation component. The encapsulation layer may include a first inorganic encapsulation layer, an organic encapsulation layer, and a second inorganic encapsulation layer. In some embodiments, the isolation component may be an encapsulation dam used to encapsulate the display device and prevent the organic encapsulation layer in the encapsulation layer from overflowing.

In the embodiments of the present disclosure, the first film layer 20 has a first surface 21 facing the second film layer 30, the second film layer 30 has a second surface 31 facing the first film layer 20, and the first surface 21 is at least partially in contact with the second surface 31. A non-flat contact area D is formed between the first film layer 20 and the second film layer 30. An adhesive material portion 40 is arranged at least partially in the non-flat contact area D to adhere the first film layer 20 and the second film layer 30.

For example, the first surface 21 and the second surface 31 are in direct contact at positions other than the non-flat contact area D (that is, a flat contact area), and are not in direct contact in the non-flat contact area D. In the non-flat contact area D, the first surface 21 and the second surface 31 are adhered by using the adhesive material portion 40. That is, in the non-flat contact area D, the first surface 21 and the second surface 31 are respectively in direct contact with the adhesive material portion 40.

An adhesion between the adhesive material portion 40 and the first film layer 20 is greater than an adhesion between the first film layer 20 and the second film layer 30, and an adhesion between the adhesive material portion 40 and the second film layer 30 is greater than the adhesion between the first film layer 20 and the second film layer 30.

According to the embodiments of the present disclosure, the non-flat contact area D is formed between the first film layer 20 and the second film layer 30. In this area, an abrupt shape change, such as a bending surface, a hole, a gap, a depression, a groove or other defects may exist between the film layers. There is a phenomenon of stress concentration at the defect position. In subsequent processing, an external force such as a shock wave may be generated due to the processing of the base substrate 10, so that the stress in the non-flat contact area D may be further increased, which may finally cause a problem such as a crack of the first film layer 20 and the second film layer 30 in the non-flat contact area D, and result in a product failure. By introducing the adhesive material portion 40, the adhesion between the first film layer 20 and the second film layer 30 in the non-flat contact area D may be significantly increased, and the problem of the crack of adjacent film layers in the non-flat contact area D may be effectively solved. In contrast, in the flat contact area, since there is no stress concentration, there is no need to provide the adhesive material portion 40, which may effectively simplify the process and save costs.

In some exemplary embodiments of the present disclosure, the first film layer 20 includes a protruding structure in the non-flat contact area. The protruding structure of the first film layer 20 is mainly located in a spacer area of an A-Hole product, or mainly located in a transition area from a source/drain electrode layer to an inorganic layer in a cross section of the back plate film layer. A base of the protruding structure is the non-flat contact area D, and a sharp angle change at this position is likely to cause a stress concentration at this position. In the subsequent processing, it is easy to be affected by the shock wave transmitted from the base substrate 10, and the problem such as cracking may occur.

According to the embodiments of the present disclosure, a material of the adhesive material portion 40 has better adhesion performance than a material of the first film layer and a material of the second film layer, and may not introduce other defects. For example, the adhesion between the adhesive material portion 40 and the first film layer 20 is greater than the adhesion between the first film layer 20 and the second film layer 30, and the adhesion between the adhesive material portion 40 and the second film layer 30 is greater than the adhesion between the first film layer 20 and the second film layer 30.

For example, the material of the adhesive material portion 40 may be an indium tin oxide (ITO) material, which has an excellent adhesion performance with the first film layer material and the second film layer material. Further, when the indium tin oxide material is used for adhesion, an adverse effect may not be introduced. For example, if other materials with good adhesion performance are used to adhere the first film layer and the second film layer, other metals may be introduced, which may result in a significant change in a resistance of a conductive layer and affect a display performance of the display substrate. In comparison, the indium tin oxide material has an excellent adhesion performance to well adhere the first film layer and the second film layer, and may not introduce an adverse factor to adversely affect the performance of the display substrate. Indium tin oxide is used here due to the excellent adhesion performance, and is used to avoid introducing defects.

In the exemplary embodiments of the present disclosure, as shown in FIG. 2a, a thickness d of the adhesive material portion 40 is set in a range of 50 nm to 100 nm. For example, the thickness d of the adhesive material portion 40 may be 60 nm to 80 nm. Specifically, the thickness d of the adhesive material portion may be 60 nm, 70 nm, or 80 nm. As shown in FIG. 2a, the thickness d of the adhesive material portion 40 refers to a vertical dimension from an upper surface of the adhesive material portion 40 to a lower surface of the adhesive material portion 40, as shown by a distance between arrows at location d in the drawing.

A width l of an orthographic projection of the adhesive material portion 40 on the base substrate 10 is 4 times to 6 times the thickness d of the adhesive material portion. Specifically, for example, the width l may be 5 times the thickness, such as 250 nm, 300 nm, or 500 nm. The width l of the adhesive material portion may also be adjusted according to an actual size of the non-flat contact area D. As shown in FIG. 2b, the width l refers to a distance from a leftmost side to a rightmost side of the orthographic projection of the adhesive material portion 40 on the base substrate 10, as shown by a distance between arrows at location l in the drawing.

As shown in FIG. 2b, in some other exemplary embodiments of the present disclosure, a structure of a display substrate 1' is as follows. A first film layer 20' is formed on a base substrate 10', a bottom of the first film layer 20' is in contact with a partial area of the base substrate 10', and the first film layer 20' is a dam formed on the base substrate 10'.

For example, the bottom of the first film layer 20' is in contact with the base substrate 10', and two lateral sides and an upper side of the first film layer 20' are in contact with the second film layer 30'. For example, an upper side of the second film layer 30' is covered with an encapsulation layer 60'. The encapsulation layer 60' may include a stacked encapsulation structure, for example, including a first inorganic encapsulation layer, an organic encapsulation layer and a second inorganic encapsulation layer.

An adhesive material portion 40' is arranged between the first film layer 20' and the second film layer 30'. The first film layer 20' has a first surface 21' facing the second film layer 30', and the second film layer 30' has a second surface 31' facing the first film layer 20'. The first film layer 20' is of a protruding structure, and a non-flat contact area D' is formed between the first film layer 20' and the second film layer 30'. The adhesive material portion 40' is arranged at least partially in the non-flat contact area D'.

For example, a lateral side of the first film layer 20' is the first surface 21' facing the second film layer 30', and the adhesive material portion 40' is in contact with the first surface 21' of the first film layer 20', the second surface 31' of the second film layer 30' and a part of an upper surface of the base substrate, so as to adhere the first film layer 20', the second film layer 30' and the base substrate 10' together.

In other embodiments, a third film layer structure, such as an interlayer dielectric layer, etc. may be further provided among the base substrate, the first film layer and the second film layer. The adhesive material portion may adhere the first film layer, the second film layer and the third film layer together, so as to form an adhesive structure. In this structure, the adhesion between the adhesive material portion and the first film layer is greater than the adhesion between the first film layer and the second film layer, the adhesion between the adhesive material portion and the second film layer is greater than the adhesion between the first film layer and the second film layer, and an adhesion between the adhesive material portion and the third film layer is greater than an adhesion between the first film layer and the third film layer.

Figure 3A:
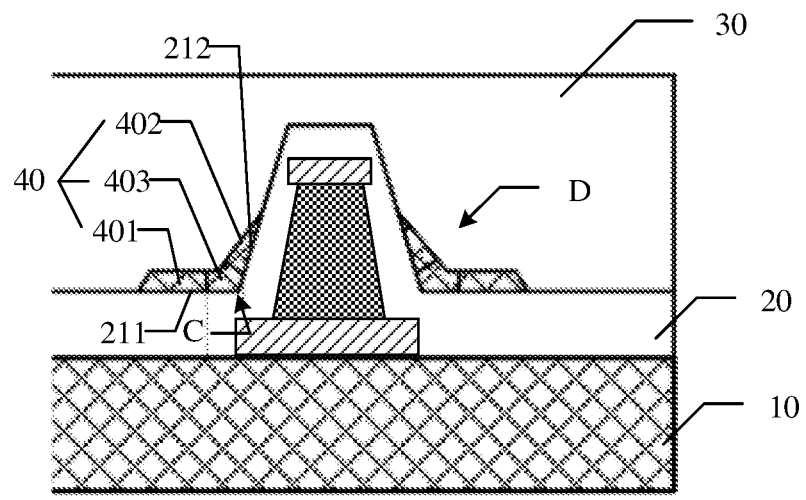

FIG. 3a is an enlarged view of a specific structure of the display substrate according to the exemplary embodiment of FIG. 2a.

As shown in FIG. 2a and FIG. 3a, the first surface 21 includes a first sub-surface 211 and a second sub-surface 212, an included angle (a second included angle) is formed between the first sub-surface 211 and the second sub-surface 212, and the included angle is an obtuse angle. The non-flat contact area D includes at least a bonding position C between the first sub-surface 211 and the second sub-surface 212. The bonding position C is formed between the first sub-surface 211 and the second sub-surface 212, and the bonding position C is a position where the two sub-surfaces intersect, and the bonding position C may be an area including an intersection of the two sub-surfaces.

The adhesive material portion 40 includes a first sub-portion 401 and a second sub-portion 402. An included angle (a first included angle) is formed between the first sub-portion 401 and the second sub-portion 402, and the included angle is an obtuse angle. The included angle between the first sub-portion 401 and the second sub-portion 402 indicates that the first sub-portion 401 and the second sub-portion 402 may form a bending surface, and an included angle of the bending surface is the included angle between the first sub-portion 401 and the second sub-portion 402. As shown in FIG. 3a, the adhesive material portion may further include a third sub-portion 403 located between the first sub-portion 401 and the second sub-portion 402.

The first sub-portion 401 is in contact with the first sub-surface 211, and the second sub-portion 402 is in contact with the second sub-surface 212. The third sub-portion 403 covers the bonding position C between the first sub-surface 211 and the second sub-surface 212, and an orthographic projection of the third sub-portion 403 on the base substrate 10 covers an orthographic projection of the bonding position C between the first sub-surface 211 and the second sub-surface 212 on the base substrate 10.

According to the embodiments of the present disclosure, by covering the bonding position C with the third sub-portion 403, the bonding position C may be located at a middle position of the bonding material portion 40, which may ensure that the adhesion between the adhesive material portion 40 and the first sub-surface 211 and the adhesion between the adhesive material portion 40 and the second sub-surface 212 are more uniform, so as to prevent the adhesive material portion 40 from partially peeling due to non-uniform adhesion.

Figure 3B:
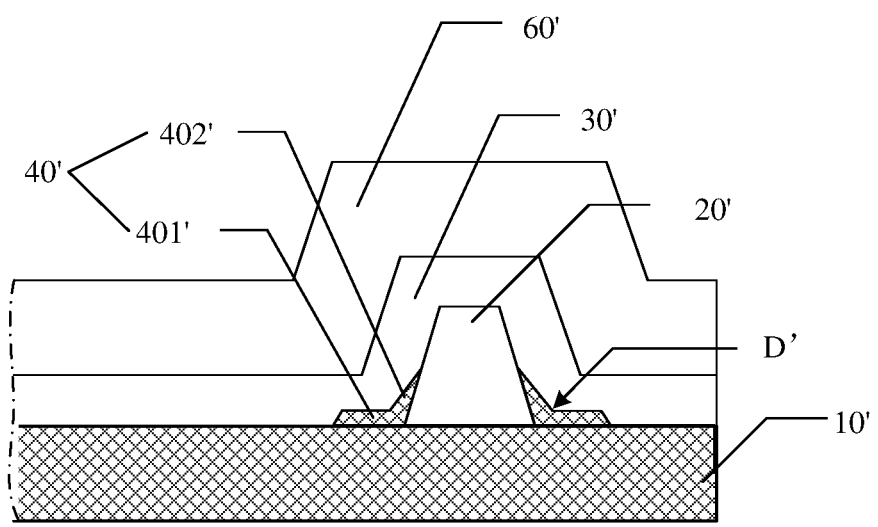
FIG. 3b is an enlarged view of a specific structure of the display substrate according to the exemplary embodiment of FIG. 2b.

FIG. 3b is an enlarged view of a specific structure of the display substrate according to the exemplary embodiment of FIG. 2b.

As shown in FIG. 2b and FIG. 3b, the adhesive material portion 40' includes a first sub-portion 401' and a second sub-portion 402'. The first sub-portion 401' is in contact with the second surface 31' and is not in contact with the first surface 21'. The second sub-portion 402' is in contact with the first surface 21' and the second surface 31'. The second sub-portion 402' covers the non-flat contact area D'.

In some exemplary embodiments of the present disclosure, the first sub-portion 401' of the adhesive material portion 40' is in contact with the second surface 31', and may adheres the base substrate 10' and the second film layer 30'. The second sub-portion 402' of the adhesive material portion 40' is in contact with the first surface 21' and the second surface 31' and may adhere the first film layer 20' and the second film layer 30'.

The second sub-portion 402' may cover the non-flat contact area D', so that the adhesive material portion 40' may completely cover the non-flat contact area D', which may ensure that no cracks may be generated between the first film layer 20' and the second film layer 30' in the non-flat contact area D' in the subsequent processing.

Figure 4:
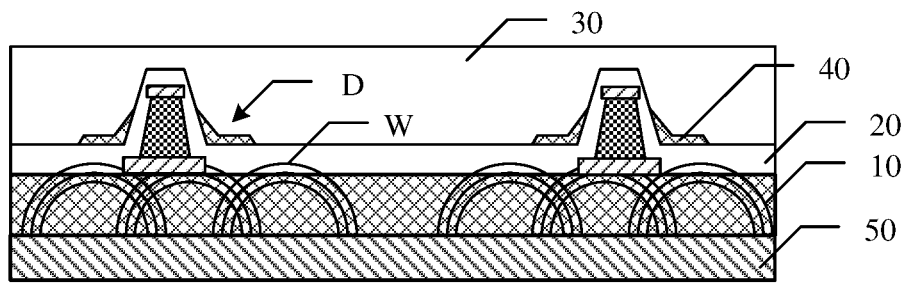
FIG. 4 is a schematic force diagram in a process of peeling a display substrate from a back plate according to some exemplary embodiments of the present disclosure.

FIG. 4 is a schematic force diagram in a process of peeling a display substrate from a back plate according to some exemplary embodiments of the present disclosure.

Subsequent to a packaging process of a display substrate, a base substrate 10 and a film layer structure on the base substrate 10 (including a first film layer 20, a second film layer 30 and an adhesive material portion 40, etc.) need to be peeled off from the back plate. In the embodiments of the present disclosure, the base substrate 10 may contain, for example, a polyimide (PI) material. The polyimide material may absorb laser energy and crack after reaching a cracking temperature. The crack occurs on a surface of the material, which is beneficial to separate the base substrate from the back plate material. In other embodiments of the present disclosure, the base substrate may contain other materials that may absorb laser energy and crack. The back plate is generally a glass back plate, or may contain other materials that may transmit laser light. The peeling process is generally a laser lift off process, such as a combination of LLO (Laser Lift Off) and De-lamina, to achieve the process of separating the film layer structure (e.g. the flexible film) from the glass back plate. The LLO is mainly performed by scanning the base substrate back and forth by laser. After PI absorbs laser energy and reaches the cracking temperature, a polymer material is partially converted into low molecules for combustion and gasification. The cracking reaction only occurs on a surface of the material. During the cracking process, a part of the low molecules undergoes a dehydrogenation reaction to produce a cracked product carbon (Ash). The laser energy penetrates and ashes the PI glue, so that an interlayer bonding between the PI glue and SiN is destroyed, and finally the separation is achieved through a blade cutting of the De-lamina.

As shown in FIG. 4, when the display substrate is peeled by the laser lift off process, charged ions are generated during the PI cracking process and erupt in a gaseous form to form a plasma, and an impact wave may be generated during a process of forming the plasma. After the impact wave is transmitted to the glass back plate 50, a part of the impact wave may be reflected back to the product, and the reflected energy may impact the film layer structure of the product in a fan shape (W in FIG. 4). A shock wave may be generated in an area where the fan-shaped reflected energy is superimposed. During a fan-shaped external diffusion, the fragile part of the film layer structure (that is, the non-flat contact area) may produce defects such as peeling and bubbles, which may even cause a crack growth in an original film layer. The crack may finally become a penetrating crack penetrating the cross-section of the film layer, which may become a water vapor channel and result in a product failure. By forming the adhesive material portion 40 in the non-flat contact area D between the first film layer 20 and the second film layer 30, an adhesion between the first film layer 20 and the second film layer 30 may be significantly improved, which may effectively prevent the problem such as the crack of the display substrate in the non-flat contact area D during the laser lift off process.

Figure 5:
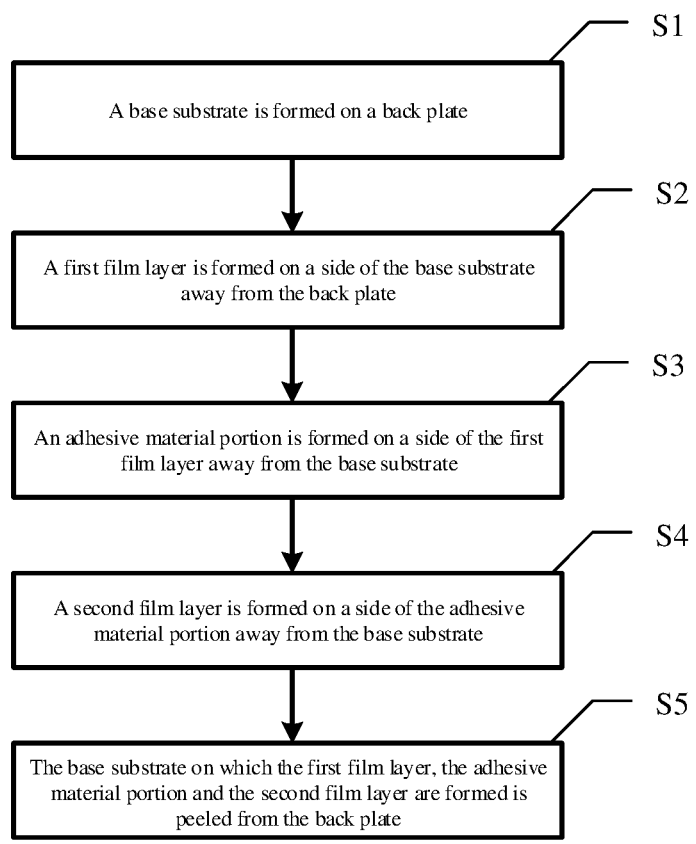
FIG. 5 is a flowchart of a method of manufacturing a display substrate according to some exemplary embodiments of the present disclosure.

FIG. 5 is a flowchart of a method of manufacturing a display substrate according to some exemplary embodiments of the present disclosure.

In the exemplary embodiments of the present disclosure, the method of manufacturing the display substrate includes step S1 to step S5.

Figure 6:
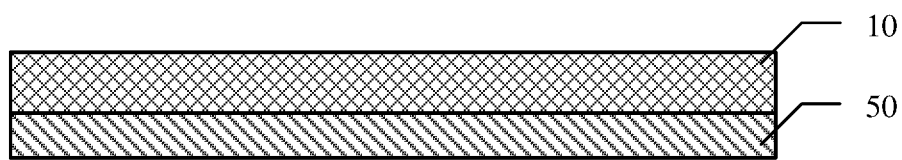
FIG. 6 is a cross-sectional structural diagram of the display substrate in step S1 according to some exemplary embodiments of the present disclosure.

In step S1, referring to FIG. 6, a base substrate is formed on a back plate.

The back plate 50 may be, for example, a glass back plate. The base substrate 10 is formed on the back plate 50 by a patterning process. The base substrate 10 may contain, for example, a polyimide material.

Figure 7:
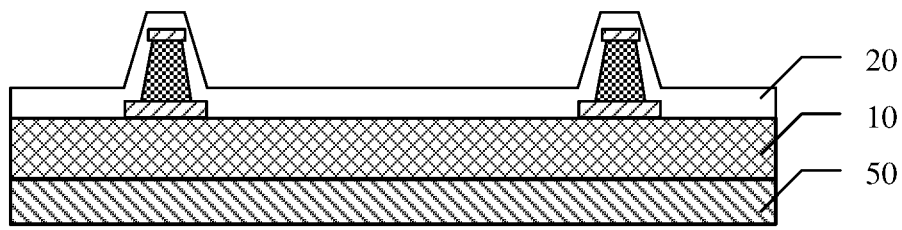
FIG. 7 is a cross-sectional structural diagram of the display substrate in step S2 according to some exemplary embodiments of the present disclosure.

In step S2, referring to FIG. 7, a first film layer 20 is formed on a side of the base substrate 10 away from the back plate 50.

After the base substrate 10 is formed, the first film layer 20 is continuously formed on an upper surface of the base substrate 10 (that is, a side away from the back plate 50). The first film layer may contain, for example, an organic layer material or an inorganic layer material. For example, the first film layer may be a film layer containing a titanium-aluminum-titanium material. The first film layer may be formed by using a sputtering deposition process.

Figure 8:
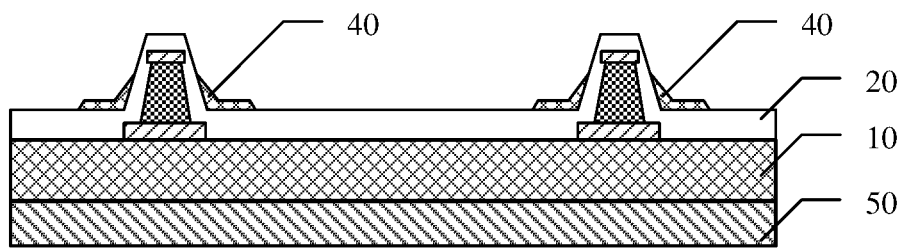
FIG. 8 is a cross-sectional structural diagram of the display substrate in step S3 according to some exemplary embodiments of the present disclosure.

In step S3, referring to FIG. 8, an adhesive material portion 40 is formed on a side of the first film layer 20 away from the base substrate 10.

After the first film layer 20 is formed, the adhesive material portion 40 is formed on an upper surface of the first film layer 20 (that is, a side away from the base substrate).

The adhesive material portion 40 is located in a non-flat contact area between the first film layer 20 and a second film layer 30. That is, the adhesive material portion 40 is formed on a base of the protruding structure on the upper surface of the first film layer. The adhesive material portion 40 may be formed, for example, by a sputtering deposition process or a cold spraying process.

A formation process of the adhesive material portion 40 is completed by inserting the formation process of the adhesive material portion 40 of the present disclosure into the formation process of the original film structure, and there is no need to greatly adjust the existing process, which may effectively save production and manufacturing costs.

Figure 9:
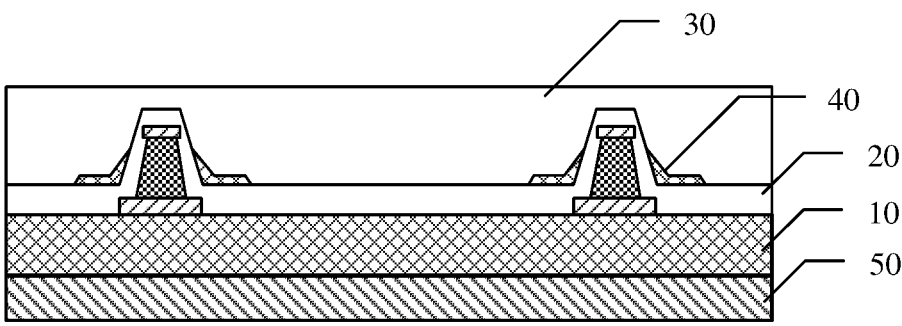
FIG. 9 is a cross-sectional structural diagram of the display substrate in step S4 according to some exemplary embodiments of the present disclosure.

In step S4, referring to FIG. 9, the second film layer 30 is formed on a side of the adhesive material portion 40 away from the base substrate 10.

After the adhesive material portion 40 is formed in the non-flat contact area, the second film layer 30 is formed on an upper side of the first film layer 20 and the adhesive material portion 40 (that is, a side away from the base substrate 10). The second film layer 30 may cover the first film layer 20 and the adhesive material portion 40. Finally, a display substrate including the back plate 50 is formed.

Figure 10A:
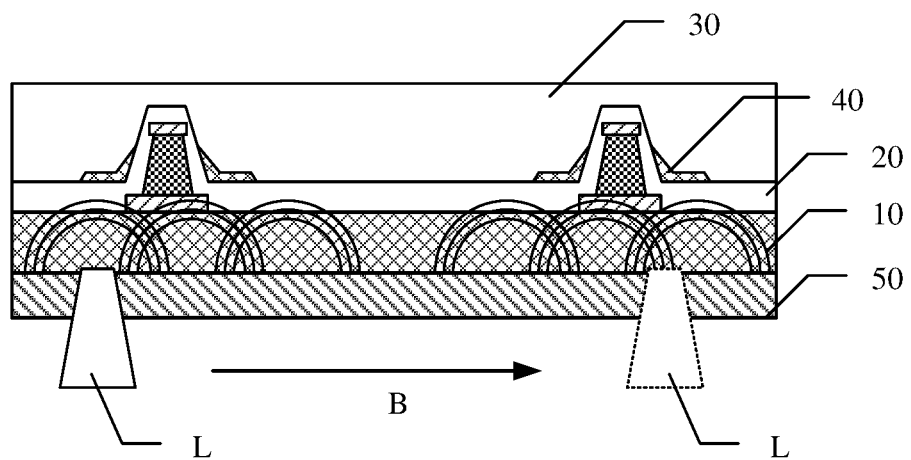
FIG. 10a is a cross-sectional structural diagram of the display substrate in step S5 during a laser lift-off according to some exemplary embodiments of the present disclosure.
Figure 10B:
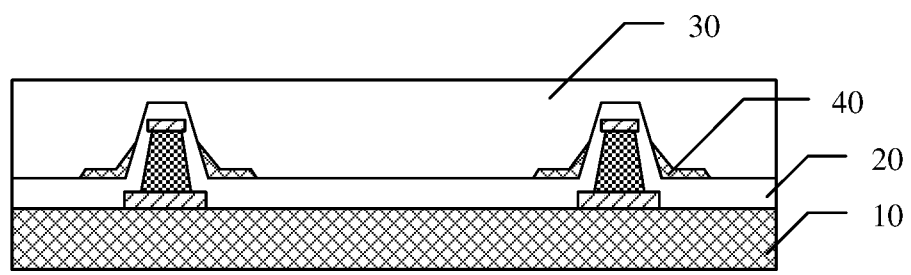
FIG. 10b is a cross-sectional structural diagram of the display substrate in step S5 after the base substrate is peeled from the back plate according to some exemplary embodiments of the present disclosure.

In step S5, referring to FIG. 10a and FIG. 10b, the base substrate 10 on which the first film layer 20, the adhesive material portion 40 and the second film layer 30 are formed is peeled from the back plate 50.

As shown in FIG. 10a, the back plate 50 is irradiated with laser. Laser L may penetrate the back plate 50 and irradiate the PI glue of the base substrate 10. The laser moves in a direction of arrow B, so that a contact area between the back plate 50 and the base substrate 10 is completely irradiated by the laser. After the base substrate 10 is irradiated by the laser, the base substrate 10 may crack, and charged ions may be generated. The charged ions may erupt in a gaseous form to form a plasma, and an impact wave may be generated with the plasma. After the impact wave is transmitted to the back plate 50, a part of the impact wave may be reflected back to the product. The reflected energy may impact the film layer structure of the product in a fan shape, and a shock wave may be generated in an area where the fan-shaped reflected energy is superimposed. However, the non-flat contact area in the exemplary embodiments of the present disclosure is provided with the adhesive material portion 40, which may effectively prevent the problem of material cracking here. After the laser light L moves in the direction of the arrow B to an edge of the base substrate 10 and the back plate 50, a bonding between the base substrate 10 and the back plate 50 may be broken. As shown in FIG. 10b, the base substrate 10 and the film layer structure on the base substrate may be finally separated from the back plate 50, so as to obtain a display substrate that only includes the base substrate 10 and the film layer structure but does not include the back plate 50.

The peeling of the base substrate from the back plate may be achieved by using a laser lift off (LLO) process. At present, a common LLO laser source device mainly includes an Excimer laser and a DPSS (fully solid state laser). The PI glue has a small difference in an absorption efficiency of the laser energy emitted by the two lasers, but transmittances of the laser energy emitted by the two lasers in the upper glass are quite different. Therefore, in practical production, an appropriate laser source device needs to be selected according to a glass material of the back plate and a thickness of the PI glue of the base substrate.

Some exemplary embodiments of the present disclosure further provide a display device including the display substrate as described above. The display device may be any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, an electronic bracelet, an electronic necklace, an electronic accessory, an electronic tattoo or a smart watch), a television, and so on.

Although some embodiments of the general technical concept of the present disclosure have been illustrated and described, it should be understood by those of ordinary skill in the art that these embodiments may be changed without departing from the principle and spirit of the general technical concept of the present disclosure. The scope of the present disclosure is defined by the claims and their equivalents.

What is claimed is:

1. A display substrate, comprising:
   a base substrate;
   a first film layer arranged on a side of the base substrate;
   a second film layer arranged on a side of the first film layer away from the base substrate; and
   an adhesive material portion arranged between the first film layer and the second film layer;
   wherein the first film layer has a first surface facing the second film layer, the second film layer has a second surface facing the first film layer, and the first surface is at least partially in contact with the second surface;
   wherein a non-flat contact area is formed between the first film layer and the second film layer, and the adhesive material portion is arranged at least partially in the non-flat contact area to adhere the first film layer and the second film layer; and
   wherein an adhesion between the adhesive material portion and the first film layer is greater than an adhesion between the first film layer and the second film layer, and an adhesion between the adhesive material portion and the second film layer is greater than the adhesion between the first film layer and the second film layer.

2. The display substrate of claim 1, wherein the adhesive material portion comprises a first sub-portion and a second sub-portion, a first included angle is formed between the first sub-portion and the second sub-portion, and the first included angle is an obtuse angle.

3. The display substrate of claim 2, wherein,
   the first surface comprises a first sub-surface and a second sub-surface, a second included angle is formed between the first sub-surface and the second sub-surface, and the second included angle is an obtuse angle;
   the non-flat contact area comprises at least a bonding position between the first sub-surface and the second sub-surface; and
   the adhesive material portion further comprises a third sub-portion located between the first sub-portion and the second sub-portion, the first sub-portion is in contact with the first sub-surface, the second sub-portion is in contact with the second sub-surface, and the third sub-portion covers the bonding position between the first sub-surface and the second sub-surface.

4. The display substrate of claim 2, wherein,
   the first sub-portion is in contact with the second surface and is not in contact with the first surface, and the second sub-portion is in contact with the first surface and the second surface; and
   the second sub-portion covers the non-flat contact area.

5. The display substrate of claim 1, wherein the adhesive material portion contains indium tin oxide.

6. The display substrate of claim 1, wherein the adhesive material portion has a thickness in a range of 50 nm to 100 nm.

7. The display substrate of claim 6, wherein a width of an orthographic projection of the adhesive material portion on the base substrate is 4 times to 6 times the thickness of the adhesive material portion.

8. The display substrate of claim 1, wherein the first film layer comprises a passivation layer, and the second film layer comprises a planarization layer.

9. The display substrate of claim 1, wherein the first film layer comprises an isolation component, and the second film layer comprises a luminescent material layer.

10. The display substrate of claim 1, wherein the base substrate contains a polyimide material.

11. A display device comprising the display substrate of claim 1.

12. A method of manufacturing a display substrate, comprising:
    forming a base substrate on a back plate;
    forming a first film layer on a side of the base substrate away from the back plate;
    forming an adhesive material portion on a side of the first film layer away from the base substrate;
    forming a second film layer on a side of the adhesive material portion away from the base substrate; and
    peeling the base substrate from the back plate, wherein the first film layer, the adhesive material portion and the second film layer are formed on the base substrate;
    wherein the first film layer has a first surface facing the second film layer, the second film layer has a second surface facing the first film layer, and the first surface is at least partially in contact with the second surface;
    wherein a non-flat contact area is formed between the first film layer and the second film layer, and the adhesive material portion is arranged at least partially in the non-flat contact area to adhere the first film layer and the second film layer; and
    wherein an adhesion between the adhesive material portion and the first film layer is greater than an adhesion between the first film layer and the second film layer, and an adhesion between the adhesive material portion and the second film layer is greater than the adhesion between the first film layer and the second film layer.

13. The method of claim 12, wherein the adhesive material portion is formed by a sputtering deposition process.

14. The method of claim 12, wherein the adhesive material portion is formed by a cold spraying process.

15. The method of claim 12, wherein the base substrate is peeled from the back plate by using a laser lift off process.

* * * * *